(12) United States Patent
Lee

(10) Patent No.: US 10,942,070 B2
(45) Date of Patent: Mar. 9, 2021

(54) SENSOR UNIT, TEMPERATURE SENSOR INCLUDING THE SAME, METHOD OF MANUFACTURING THE SENSOR UNIT, AND METHOD OF MANUFACTURING THE TEMPERATURE SENSOR

(71) Applicant: HAESUNG DS CO., LTD., Changwon-si (KR)

(72) Inventor: Jin Woo Lee, Seoul (KR)

(73) Assignee: HAESUNG DS CO., LTD., Changwon-si (KR)

( * ) Notice: Subject to any disclaimer, the term of this patent is extended or adjusted under 35 U.S.C. 154(b) by 150 days.

(21) Appl. No.: 16/145,046

(22) Filed: Sep. 27, 2018

(65) Prior Publication Data
US 2019/0353531 A1    Nov. 21, 2019

(30) Foreign Application Priority Data
May 21, 2018  (KR) .................. 10-2018-0057988

(51) Int. Cl.
  *G01K 1/14*      (2021.01)
  *G01K 7/02*      (2021.01)
  (Continued)

(52) U.S. Cl.
  CPC ........... *G01K 7/021* (2013.01); *H05K 1/0298* (2013.01); *H05K 3/4046* (2013.01); *G01K 1/14* (2013.01); *G01K 1/16* (2013.01)

(58) Field of Classification Search
  CPC ........... G01N 27/4045; G01N 27/4074; G01N 2021/1704; G01N 25/56; G01N 31/229;
  (Continued)

(56) References Cited

U.S. PATENT DOCUMENTS 2,609,688 A * 9/1952 Larach ................. G01N 27/121
                                                      73/335.04
3,056,935 A * 10/1962 Jensen ................. G01N 27/121
                                                      338/35
(Continued)

FOREIGN PATENT DOCUMENTS

CN       102568865 A      7/2012
CN       103172890 A      6/2013
(Continued)

OTHER PUBLICATIONS

Korean Intellectual Property Office, Office Action in Korean Patent Application No. 10-2018-0057988, dated Jan. 9, 2019, 44 pages.
(Continued)

*Primary Examiner* — Gail Kaplan Verbitsky
(74) *Attorney, Agent, or Firm* — Schwabe, Williamson & Wyatt, P.C.

(57) ABSTRACT

Provided is a temperature sensor including a carrier substrate; a sensor unit positioned on the carrier substrate and including a base layer and an electric conductive layer, the base layer having surface hygroscopicity, and the electric conductive layer being on an external surface of the base layer; a pad unit electrically connected to opposite ends of the sensor unit; and a cover unit positioned on the sensor unit and configured to cover the sensor unit.

13 Claims, 7 Drawing Sheets

(51) Int. Cl.
*H05K 3/40* (2006.01)
*H05K 1/02* (2006.01)
*G01K 1/16* (2006.01)

(58) Field of Classification Search
CPC ............ G01K 13/00; G01K 7/16; G01K 1/08; G01K 1/14; G01K 1/10; G01K 7/00
See application file for complete search history.

(56) References Cited

U.S. PATENT DOCUMENTS

| | | | | |
|---|---|---|---|---|
| 3,266,661 | A | * | 8/1966 | Dates .................... H01C 17/06 220/62.15 |
| 3,550,439 | A | * | 12/1970 | Penoyer, Sr. ........ G01N 27/121 73/73 |
| 3,652,332 | A | * | 3/1972 | Brand .................. H05K 1/0386 427/97.4 |
| 3,867,245 | A | * | 2/1975 | Herman ................... H01B 3/04 428/114 |
| 4,050,048 | A | * | 9/1977 | Frazee ................. G01N 27/121 338/35 |
| 4,120,813 | A | * | 10/1978 | Hatanaka ................. C08K 3/04 252/194 |
| 4,603,372 | A | * | 7/1986 | Abadie ................. G01N 27/225 257/467 |
| 5,533,393 | A | * | 7/1996 | Bonne .................... G01N 25/66 324/663 |
| 5,841,285 | A | * | 11/1998 | Bailey ................. H01M 10/488 324/435 |
| 6,812,821 | B2 | * | 11/2004 | Fujita ................... G01N 27/121 338/34 |
| 9,320,145 | B2 | | 4/2016 | Britton et al. |
| 9,659,691 | B2 | * | 5/2017 | Ito ............................ H01C 7/04 |
| 2004/0056753 | A1 | | 3/2004 | Chiang et al. |
| 2004/0081852 | A1 | * | 4/2004 | Chen .................. H01L 51/5259 428/690 |
| 2004/0155751 | A1 | * | 8/2004 | Benzel ................. G01N 27/121 338/35 |
| 2009/0184830 | A1 | * | 7/2009 | Watabe ................ G01N 29/024 340/628 |
| 2010/0119789 | A1 | | 5/2010 | Grande |
| 2015/0071326 | A1 | * | 3/2015 | Nagatomo ............. H01C 7/008 374/185 |
| 2015/0144380 | A1 | | 5/2015 | Yang et al. |
| 2015/0373782 | A1 | | 12/2015 | Kang et al. |
| 2017/0038325 | A1 | * | 2/2017 | Takashima ......... G06K 19/0702 |
| 2017/0188413 | A1 | * | 6/2017 | Hsu ........................ G01N 27/12 |

FOREIGN PATENT DOCUMENTS

| | | | |
|---|---|---|---|
| CN | 103210703 A | | 7/2013 |
| CN | 103688320 A | | 3/2014 |
| CN | 105874889 A | | 8/2016 |
| CN | 106119928 A | | 11/2016 |
| CN | 107652676 A | | 2/2018 |
| DE | 003207979 A1 | * | 9/1983 |
| DE | 19852969 A1 | * | 5/2000 ........... G01N 27/403 |
| GB | 2043908 A | * | 10/1980 ........... G01N 27/225 |
| JP | S51144952 A | | 12/1976 |
| JP | 59091353 A | * | 5/1984 ........... G01N 27/121 |
| JP | S64680 A | | 1/1989 |
| JP | 352051880 A | * | 4/1997 |
| JP | 402228546 A | * | 9/1998 |
| JP | 2008130939 A | | 6/2008 |
| JP | 2013539908 A | | 10/2013 |
| KR | 20160095382 A | | 8/2016 |
| KR | 101654025 B1 | | 9/2016 |
| KR | 20170126304 A | | 11/2017 |
| TW | 201120922 A | | 6/2011 |

OTHER PUBLICATIONS

Third Office Action for Taiwanese Patent Application No. 107134731 dated Oct. 14, 2020, 7 pgs. (with partial English translation).
First Office Action for Chinese Application No. 201811358303.5 dated Sep. 24, 2020, 13 pgs. (with partial English translation).

* cited by examiner

SENSOR UNIT, TEMPERATURE SENSOR INCLUDING THE SAME, METHOD OF MANUFACTURING THE SENSOR UNIT, AND METHOD OF MANUFACTURING THE TEMPERATURE SENSOR

CROSS-REFERENCE TO RELATED APPLICATION

This application claims the benefit of Korean Patent Application No. 10-2018-0057988, filed on May 21, 2018, in the Korean Intellectual Property Office, the disclosure of which is incorporated herein in its entirety by reference.

BACKGROUND

1. Field

One or more embodiments relate to a method of manufacturing a sensor unit with improved sensitivity and in a simple manner, a method of manufacturing a temperature sensor including the sensor unit, and a temperature sensor manufactured using the method.

2. Description of the Related Art

Temperature sensors are used in various devices such as home appliances, temperature measuring devices, and very large scale integration (VLSI) chips. Usual materials or electronic devices may be generally used to make temperature sensors since the electrical characteristics thereof change with temperature. However, only a usual material or an electronic device which is fit for an intended use in terms of a detection temperature range, detection temperature accuracy, temperature characteristics, mass productivity, reliability, etc., may be used as a temperature sensor.

For example, a thermocouple, a resistance temperature detector, a thermistor (e.g., a negative temperature coefficient (NTC) thermistor), and a metal thermometer are usually used for industrial measurements. A thermistor (e.g., an NTC thermistor, a positive temperature coefficient (PTC) thermistor, or a critical temperature resistor (CTR)), a thermo-sensitive ferrite, and a metal thermometer are usually used as sensors in devices necessary in daily life. Sensors using nuclear quadrupole resonance (NQR), ultrasonic waves, or optical fiber are used for special purposes. A gas thermometer, a glass double tube thermometer, a quartz thermometer, a platinum resistance temperature detector, and a platinum-platinum rhodium thermocouple are used to detect a temperature reference.

In particular, an NTC thermistor is a resistor which has a negative temperature coefficient α and a resistance value that decreases as a temperature increases. Metal oxide (e.g., MgO or TiO) is used as a material of the NTC thermistor, and a property value of the NTC thermistor is determined according to a form and composition thereof.

As demand for flexible wearable devices has increased, demand for flexible sensors has also increased. Flexible thermistors according to the related art are manufactured by depositing an interconnection metal on a plastic substrate so as to sense a temperature according to a change in the resistance of the metal with temperature.

However, such thermistors have low resistance sensitivity to temperature, and therefore, another circuit component is required to increase the sensitivity to temperature or a micro device is additionally required to form an integrated circuit. Accordingly, the manufacturing processes are complex and the manufacturing cost increases.

SUMMARY

One or more embodiments include a method of manufacturing a sensor unit with improved sensitivity and in a simple manner, a method of manufacturing a temperature sensor including the sensor unit, and a temperature sensor manufactured using the method.

Additional aspects will be set forth in part in the description which follows and, in part, will be apparent from the description, or may be learned by practice of the presented embodiments.

According to one or more embodiments, a temperature sensor includes a carrier substrate; a sensor unit positioned on the carrier substrate and including a base layer and an electric conductive layer, the base layer having surface hygroscopicity, and the electric conductive layer being applied to an external surface of the base layer; a pad unit electrically connected to opposite ends of the sensor unit; and a cover unit positioned on the sensor unit and covering the sensor unit.

The pad unit may include a first pad and a second pad, the first pad being connected to one of the opposite ends of the sensor unit, and the second pad being connected to the other one of the opposite ends of the sensor unit; and a width of the first and second pads in a first direction may be substantially equal to a width of the electric conductive layer of the sensor unit in the first direction.

The base layer may include a paper-making material.

The electric conductive layer may include a conductive polymeric material.

The electric conductive layer may include silicon oxide ($SiO_x$) or graphene oxide (GO).

The sensor unit may further include a coating layer, the electric conductive layer may be positioned on a surface of the base layer, and the coating layer may be positioned on an opposite surface of the base layer.

The pad unit may be in direct contact with the electric conductive layer.

According to one or more embodiments, a method of manufacturing a sensor unit includes preparing a base layer including a paper-making material, the base layer having surface hygroscopicity; forming a conductive polymer solution including a conductive polymeric material; forming an electric conductive layer on a surface of the base layer by soaking the base layer in the conductive polymer solution; and performing a heat treatment on the base layer having the electric conductive layer thereon.

The forming of the conductive polymer solution may include mixing and stirring the conductive polymeric material with a non-conductive material.

The non-conductive material may include $SiO_x$ or GO.

The method may further include designing an initial resistance of the sensor unit by cutting the base layer.

The method may further include forming a coating layer on a surface of the base layer before the forming of the electric conductive layer.

According to one or more embodiments, a method of manufacturing a temperature sensor includes manufacturing a sensor unit; positioning the sensor unit on a carrier substrate; forming a pad unit at opposite ends of the sensor unit, the pad unit being electrically connected to the sensor unit; and forming a cover unit on the sensor unit to cover the sensor unit.

The forming of the pad unit may include forming a first pad and a second pad, the first pad being connected to one of the opposite ends of the sensor unit, and the second pad being connected to the other one of the opposite ends of the sensor unit; and a width of the first and second pads in a first direction may be substantially equal to a width of the sensor unit in the first direction.

Other aspects, features, and advantages than those described above will be clear from the accompanying drawings, the claims, and the description of embodiments below.

These general and specific aspects may be embodied using a system, a method, a computer program, or a combination thereof.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
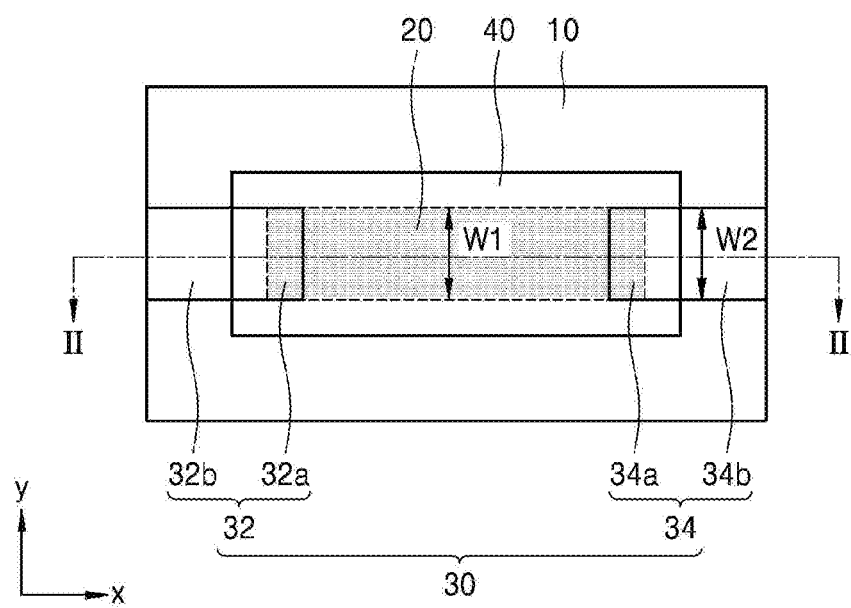
FIG. 1 is a schematic plan view of a temperature sensor according to an embodiment.

The present disclosure may include various modifications and different embodiments. In this regard, specific embodiments are illustrated in the drawings and will be described in detail. Advantageous effects, features, and methods for achieving the effects and features will become more apparent by explaining the embodiments in detail with reference to the accompanying drawings. However, the present disclosure is not limited to these embodiments but may be implemented in various modes.

The embodiments of the present disclosure will now be described in detail with reference to the accompanying drawings, in which like reference numerals denote like elements, and thus their description will be omitted.

The terms first, second, etc. are used in the description of the embodiments to only distinguish one element from another. In addition, the singular forms "a", "an" and "the" are intended to include the plural forms as well, unless the context clearly indicates otherwise.

It will be further understood that the terms "comprises" and/or "comprising," or "includes" and/or "including" when used in this specification, specify the presence of stated features or components, but do not preclude the presence or addition of one or more other features or components. It also will be understood that when a portion of a film, a region, an element, or the like is referred to as being "on" another portion, it can be directly on the other portion, or intervening films, regions, or elements may also be present. In the drawings, the size of elements may be exaggerated or reduced for clarity.

In the drawings, the size of elements may be exaggerated or reduced for clarity. For instance, the size and thickness of each element may be arbitrarily illustrated in the drawings, and therefore, the present disclosure is not limited to the drawings.

In addition, the x, y and z axes may not be limited to the three axes of a rectangular coordinates system and may be interpreted in a wider sense. For example, the x, y and z axes may be orthogonal to one another or may indicate different directions which are not orthogonal.

When it is possible to modify an embodiment, the order of processes may be different from the order in which the processes have been described. For instance, two processes described as being performed sequentially may be substantially performed simultaneously or in a reverse order.

As used herein, the term "and/or" includes any and all combinations of one or more of the associated listed items.

Figure 2:
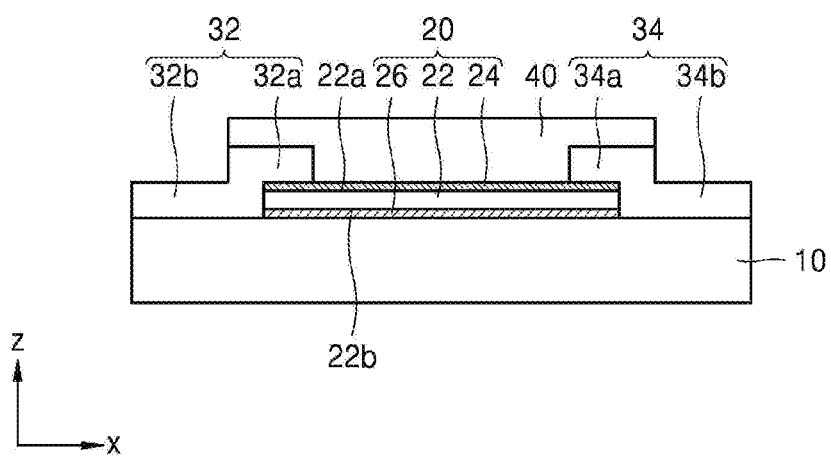
FIG. 2 is a cross-sectional view taken along line II-II in FIG. 1.

FIG. 1 is a schematic plan view of a temperature sensor 100 according to an embodiment. FIG. 2 is a cross-sectional view taken along line II-II in FIG. 1.

Referring to FIGS. 1 and 2, the temperature sensor 100 may include a carrier substrate 10, a sensor unit 20 positioned on the carrier substrate 10, a pad unit 30 electrically connected to the sensor unit 20, and a cover unit 40 covering the sensor unit 20.

The carrier substrate 10 may support the sensor unit 20 positioned thereon and may include a rigid or flexible material. The carrier substrate 10 may be larger than the sensor unit 20, but the present disclosure is not limited thereto.

When the carrier substrate 10 includes a rigid material, the carrier substrate 10 may include a material such as glass, metal, or ceramics. When the carrier substrate 10 includes a flexible material, the carrier substrate 10 may sufficiently support the sensor unit 20, and the carrier substrate 10 may include a plastic material such as polyethylen terephthalate (PET), polyethylen naphthalate (PEN), or polyimide.

The sensor unit 20 may be positioned on the carrier substrate 10. In an embodiment, the sensor unit 20 may be a thin-film sensor unit and may function as, for example, a temperature sensor. The sensor unit 20 may have conductivity and may be an element fundamentally having an initial resistance.

In an embodiment, the temperature sensor 100 may sense a temperature by measuring a change in the initial resistance of the sensor unit 20. The sensor unit 20 may be a negative temperature coefficient (NTC) element of which the initial resistance value decreases as the temperature increases. In one or more embodiments, the sensor unit 20 may be a positive temperature coefficient (PTC) element of which the initial resistance value increases as the temperature increases.

Referring to FIG. 1, the sensor unit 20 has a rectangular shape extending in a length direction (e.g., an x-axis direction), but the sensor unit 20 may have various shapes. In particular, according to embodiments, the sensor unit 20 may be formed in various shapes according to the material characteristics thereof.

In other words, a base layer 22 of the sensor unit 20 may include a paper-making material, which is easily processed, and therefore, the sensor unit 20 may be freely shaped. Since the initial resistance value of the sensor unit 20 is determined by a thickness, width, length thereof, etc., the initial resistance and sensitivity of the sensor unit 20 may be variously set by properly shaping the sensor unit 20.

In an embodiment, when the sensor unit 20 is installed in a clinical thermometer, the sensor unit 20 may have a size with a length (in the x-axis direction) of about 5 mm to about 7 mm and a width (in a y-axis direction) of about 2 mm. In this case, the initial resistance of the sensor unit 20 may be about 30 kΩ to 100 kΩ, which is substantially the same as the initial resistance of a sheet. However, this is just an embodiment. It is apparent that the size and the shape of the sensor unit 20 may vary according to the specifications of an apparatus in which the sensor unit 20 is installed.

The structure of the sensor unit 20 will be described in detail with reference to FIGS. 5 and 6.

Referring to FIG. 2, the sensor unit 20 may include the base layer 22, an electric conductive layer 24 positioned on a first surface 22a of the base layer 22, and a coating layer 26 positioned on a second surface 22b of the base layer 22. In one or more embodiments, instead of the coating layer 26, another electric conductive layer 24 may be formed on the second surface 22b of the base layer 22. In this case, the electric conductive layers 24 may be respectively positioned on opposite surfaces of the base layer 22.

The base layer 22 may include a paper-making material having surface hygroscopicity. The paper-making material refers to a paper material formed by thinly binding together plant fiber such as wood pulp. In an embodiment, standardized printing paper (e.g., A4 paper) may be used, but the present disclosure is not limited thereto.

Regarding the paper-making material according to an embodiment, paper quality is important and particularly depends on a sizing degree (according to ISO 535 Cobb). The paper-making material including hydrophilic cellulose fiber tends to get wet. A process of providing resistance against water, i.e., water resistance, is referred to a sizing process, and a digitized water resistance is referred to a sizing degree. For example, standardized printing paper (with a basis weight of about 75 g/m² to about 90 g/m² and a thickness of about 100 μm to about 110 μm) has a sizing degree of about 20 g/m² to about 50 g/m², and therefore, the base layer 22 may also have a sizing degree of about 20 g/m² to about 50 g/m². In other words, any paper-making material that has a sizing degree of about 20 g/m² to about 50 g/m² may be used for the base layer 22.

For reference, a Cobb sizing tester may be used in a method of performing a sizing process. For measurement, paper is positioned at the tester and a ring of the tester is fixed onto the paper. It will do as long as the paper is small enough to be inside the ring. Usually, the paper is cut into a size of 15 cm×15 cm for the measurement. 100 ml water is poured into the tester. The tester is drained after two minutes. Remaining water is removed from the paper using filter paper or the like, and a weight difference in the paper between before and after water absorption is obtained. A figure obtained by multiplying the weight difference by 100 is a Cobb sizing degree.

Filter paper or a membrane, which has not undergone a sizing process, or a paper-making material, which has a high water resistance of at least about 50 g/m², may not be used as a paper-making material in the embodiments of the present disclosure. In other words, paper-making materials only having a sizing degree of about 20 g/m² to about 50 g/m² may be usable.

In an experiment, when a membrane or filter paper is used, the electric conductive layer 24 was not properly formed on the membrane or the filter paper. These materials have not water resistance, thereby allowing a conductive polymeric material of the electric conductive layer 24 to pass through the base layer 22 together with water. As a result, the conductive polymeric material is not adsorbed onto the base layer 22 and does thus not form a layer. A procedure for forming the sensor unit 20 will be described in detail with reference to FIG. 7.

The electric conductive layer 24 may be positioned on the first surface 22a of the base layer 22. The electric conductive layer 24 may include a conductive polymeric material. The conductive polymeric material is usually a polymer that shows a conductivity of at least $10^{-7}$ Scm$^{-1}$ (which is equal to or higher than the conductivity of a semiconductor). A high conductivity is usually obtained by doping a polymer with an electron acceptor or an electron donor. A polythiophene group, a polypyrole group, a polyanyiline group, a polyacetylene group, a polyphenylene group, or a mixture thereof may be used for a conductive polymer. In particular, poly(3,4-ethylenedioxythiophene) polystyrene sulfonate (PEDOT:PSS) in the polythiophene group may be used.

In addition, the electric conductive layer 24 may include a non-conductive material. The initial resistance of the sensor unit 20 may be controlled using the non-conductive material. In an embodiment, when the electric conductive layer 24 includes a non-conductive material, the initial resistance and the resistance change of the electric conductive layer 24 may be increased. Silicon oxide (SiO$_x$) or graphene oxide (GO) may be used to form the non-conductive material.

The coating layer 26 may be positioned on the second surface 22b of the base layer 22. The coating layer 26 may include a hydrophobic material. The hydrophobic material may be a material which does not have a group, such as a hydroxyl group, an amino group, or a carboxyl group, having an affinity with water molecules. Oil-based ink or acrylic ink may be used for the hydrophobic material.

When the coating layer 26 is formed as described above, the electric conductive layer 24 may be positioned only on the first surface 22a of the base layer 22. In one or more embodiments, the coating layer 26 may not be formed and the electric conductive layer 24 may be positioned on each of opposite surfaces of the base layer 22. However, since the conductive polymeric material of the electric conductive layer 24 is not formed by absorbing the base layer 22, forming a conductive polymer on each of the opposite surfaces of the electric conductive layer 24 does not function to greatly enhance the characteristics of the sensor unit 20. Since forming the electric conductive layer 24 only on the first surface 22a of the base layer 22 is more advantageous to manufacturing, the coating layer 26 may be positioned on the second surface 22b of the base layer 22, as described above.

In one or more embodiments, the coating layer 26 may be formed only on a portion of the first surface 22a of the base layer 22. At this time, a pattern of the electric conductive layer 24 may be determined according to a pattern of the coating layer 26. In other words, the coating layer 26 may be formed only on the portion of the first surface 22a of the base layer 22 before the electric conductive layer 24 is formed, so that the electric conductive layer 24 may be selectively formed on a remaining portion other than the portion of the first surface 22a on which the coating layer 26 has been formed. Accordingly, the pattern of the electric conductive layer 24 may be freely formed.

The pad unit 30 may be positioned on the carrier substrate 10. The pad unit 30 may be connected to opposite ends of the sensor unit 20 to be electrically connected with the sensor unit 20. Referring to FIG. 1, the sensor unit 20 may be positioned on the carrier substrate 10, and the pad unit 30 may be positioned on the sensor unit 20. The pad unit 30 may function as a terminal for connection of the sensor unit 20 to an external device (not shown).

First portions 32a and 34a of the pad unit 30 may be connected to the sensor unit 20. Second portions 32b and 34b of the pad unit 30 may be exposed outside. When the first portions 32a and 34a of the pad unit 30 are connected to the sensor unit 20, it may be considered that the first portions 32a and 34a of the pad unit 30 are in contact with the electric conductive layer 24 of the sensor unit 20. The pad unit 30 may include a first pad 32 and a second pad 34. The first pad 32 may be connected to an end of the sensor unit 20 and the second pad 34 may be connected to an opposite end of the sensor unit 20.

In an embodiment, the sensor unit 20 may have a first width W1 in a width direction (e.g., the y-axis direction). The width direction (i.e., the y-axis direction) may be perpendicular to the length direction (i.e., the x-axis direction) of the sensor unit 20. The pad unit 30 may be positioned at the opposite ends of the sensor unit 20 in the length direction (i.e., the x-axis direction). The pad unit 30 may have a second width W2 in the width direction (i.e., the y-axis direction). The first width W1 is substantially equal to the second width W2.

When the second width W2 of the pad unit 30 is less than the first width W1 of the sensor unit 20, the electric conductive layer 24 may not be used for sheet resistance, and therefore, the initial resistance value of the sensor unit 20 may change. Accordingly, it is desired that the second width W2 of the pad unit 30 is the same as the first width W1 of the sensor unit 20.

In one or more embodiments, the pad unit 30 may be connected to the sensor unit 20 directly, as shown in FIGS. 1 and 2, or through a metal lead (not shown).

The cover unit 40 may be positioned on the sensor unit 20. The sensor unit 20 includes a paper-making material and thus very sensitive to external humidity. Accordingly, the reliability of the temperature sensor 100 may be secured by sealing the sensor unit 20 with the cover unit 40. The cover unit 40 may cover the entire surface of the sensor unit 20 and at least a portion of the pad unit 30 contacting the sensor unit 20. Referring to FIG. 1, at least a portion of the cover unit 40 may be in direct contact with the carrier substrate 10, thereby maintaining the sealing of the sensor unit 20.

The cover unit 40 may include an insulating material, for example, an organic film, an inorganic film, or an organic-inorganic composite film. The organic film may include polyethylene terephthalate, polyethylene naphthalate, polycarbonate, polyimide, polyethylene sulfonate, polyoxymethylene, polyacrylate, and/or hexamethyldilsiloxane. The inorganic film may include silicon oxide, silicon nitride, and/or silicon oxynitride. The inorganic film may be formed using a transparent or translucent material.

The first portions 32a and 34a of the pad unit 30 may be covered by the cover unit 40. The second portions 32b and 34b of the pad unit 30 may be exposed outside. When the first portions 32a and 34a of the pad unit 30 are covered by the cover unit 40, it may be considered that the first portions 32a and 34a of the pad unit 30 are covered by the sensor unit 20 and the cover unit 40, which covers the sensor unit 20, as shown in FIG. 1. In the current embodiment, the sensor unit 20 is positioned first on the carrier substrate 10, and the pad unit 30 is positioned on the sensor unit 20, so the first portions 32a and 34a of the pad unit 30 are interposed between the sensor unit 20 and the cover unit 40.

Figure 3:
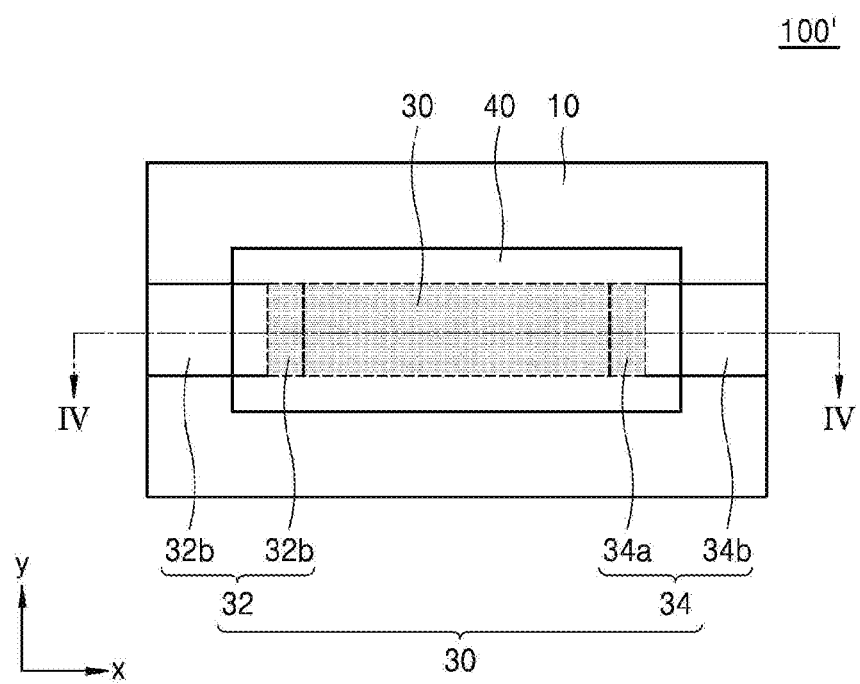
FIG. 3 is a schematic plan view of a temperature sensor according to one or more embodiments.
Figure 4:
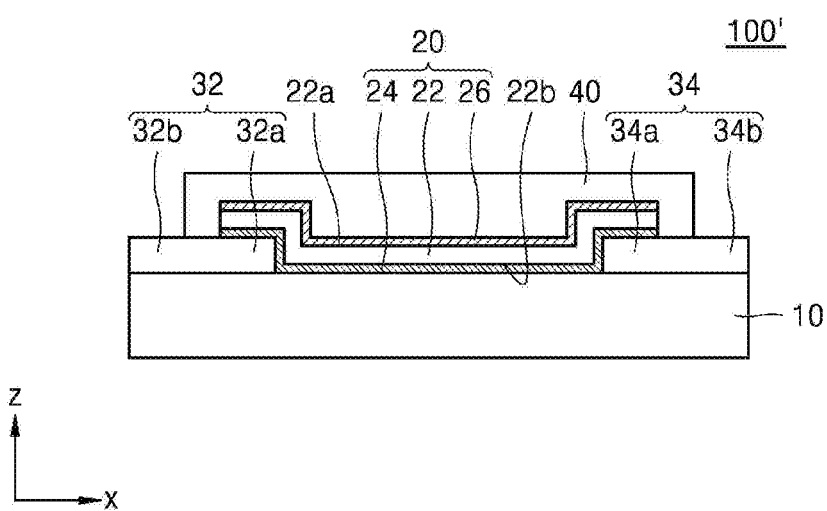
FIG. 4 is a cross-sectional view taken along line IV-IV in FIG. 3.

FIG. 3 is a schematic plan view of a temperature sensor 100' according to one or more embodiments. FIG. 4 is a cross-sectional view taken along line IV-IV in FIG. 3.

The temperature sensor 100' of FIGS. 3 and 4 is different from the temperature sensor 100 of FIGS. 1 and 2 in an arrangement of the sensor unit 20 and the pad unit 30. The difference will be described below, and redundant descriptions will be omitted.

The pad unit 30 may be positioned on the carrier substrate 10 and the sensor unit 20 may be positioned on the pad unit 30. The sensor unit 20 may overlap at least a portion of the pad unit 30. As described above with reference to FIG. 1, the pad unit 30 needs to be in direct contact with the electric conductive layer 24. Accordingly, the electric conductive layer 24 may be positioned on the second surface 22b of the base layer 22 and the coating layer 26 may be positioned on the first surface 22a of the base layer 22.

The cover unit 40 may be formed on the sensor unit 20 in the same manner as described above.

Figure 5:
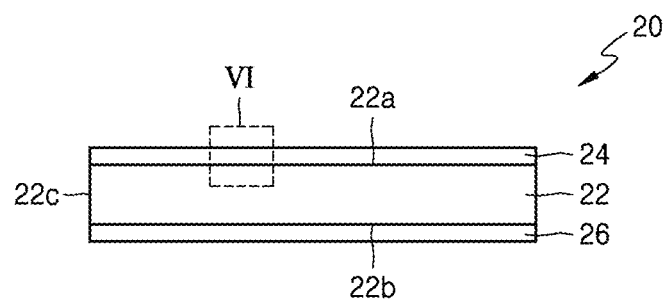
FIG. 5 is a schematic cross-sectional view of a sensor unit according to an embodiment.

FIG. 5 is a schematic cross-sectional view of the sensor unit 20 according to an embodiment. FIG. 6 is a scanning electron microscope (SEM) photo of portion VI of FIG. 5.

Referring to FIG. 5, the sensor unit 20 may include the base layer 22, the electric conductive layer 24 positioned on the first surface 22a of the base layer 22, and the coating layer 26 positioned on the second surface 22b of the base layer 22. The electric conductive layer 24 may extend along a side surface 22c, which connects the first surface 22a with the second surface 22b in the base layer 22.

As described above, the base layer 22 may be formed using a paper-making material having surface hygroscopicity. The paper-making material may refer to a paper material formed by thinly binding together plant fiber such as wood pulp. In an embodiment, standardized printing paper may be used. In the current embodiment, the base layer 22 may have a sizing degree of about 20 g/m² to about 50 g/m². The standardized printing paper has the sizing degree of about 20 g/m² to about 50 g/m². However, the present disclosure is not limited to the current embodiment. Any paper-making material that has the sizing degree described above may be used for the base layer 22.

The electric conductive layer 24 may be positioned on the first surface 22a of the base layer 22. The electric conductive layer 24 may include a conductive polymeric material and may be formed by soaking the base layer 22 in a solution, which is a mixture of the conductive polymeric material and water. The thickness of the electric conductive layer 24 may be controlled by controlling a soak time. Thereafter, the electric conductive layer 24 may be formed by performing a heat treatment on the base layer 22, on which the conductive polymeric material has been deposited.

The electric conductive layer 24, which has been formed through the processes described above, may be positioned on the first surface 22a of the base layer 22. Referring to FIG. 6, the electric conductive layer 24 only lies on the first surface 22a of the base layer 22 but not permeates through the first surface 22a.

The electric conductive layer 24 may have a thickness of about 1 μm to about 8 μm, and more desirably, of about 2 μm to about 3 μm. The initial resistance of the sensor unit 20 may be controlled through the thickness of the electric conductive layer 24.

Although the coating layer 26 is provided on the second surface 22b of the base layer 22 in the current embodiment, the coating layer 26 may be omitted in one or more embodiments. When the coating layer 26 is omitted, the electric conductive layer 24 may be positioned on each of the opposite surfaces of the base layer 22. At this time, the electric conductive layer 24 may also be formed on side surfaces of the base layer 22, thereby covering the entire surface of the base layer 22.

Although the descriptions have been focused on the temperature sensor 100, the present disclosure is not limited thereto. For example, a method of manufacturing the temperature sensor 100 will also belong to the scope of the present disclosure.

Figure 7:
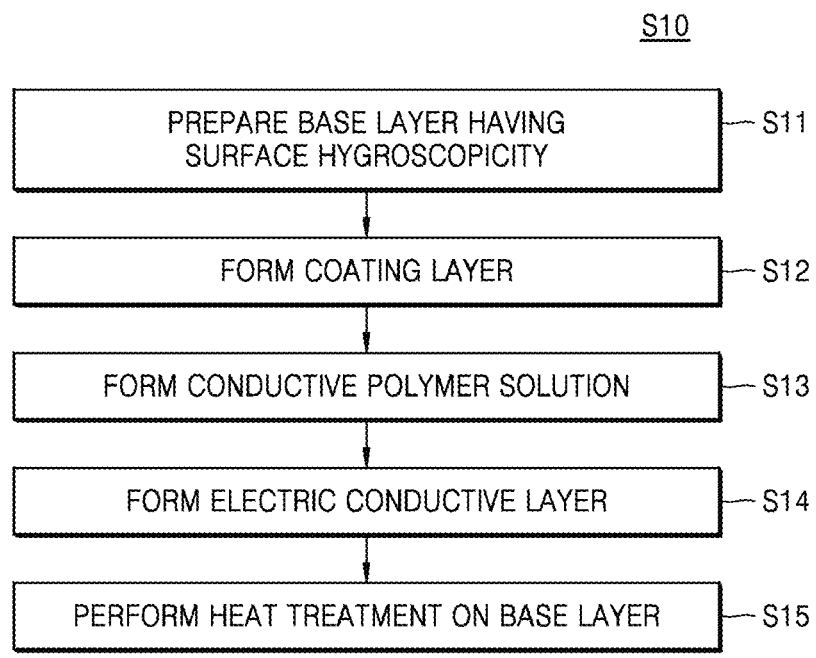
FIG. 7 is a flowchart of a method of manufacturing a sensor unit, according to an embodiment.
Figure 8:
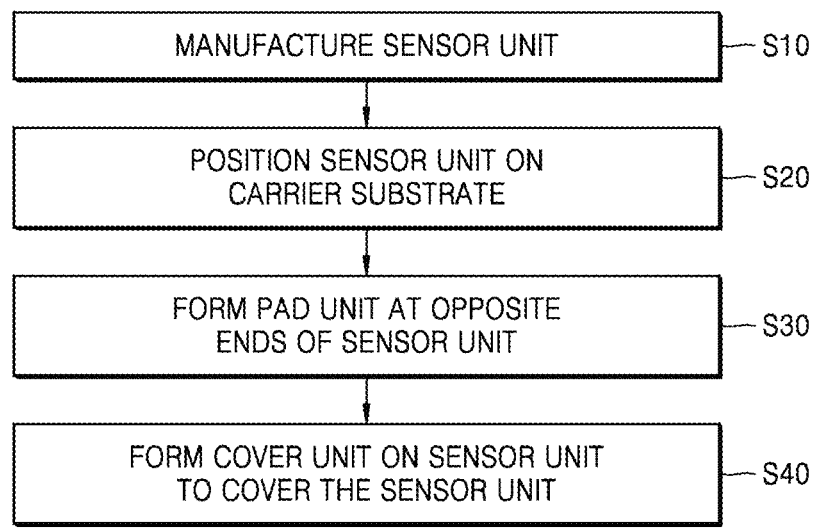
FIG. 8 is a flowchart of a method of manufacturing a temperature sensor, according to an embodiment.

FIG. 7 is a flowchart of a method of manufacturing the sensor unit 20, according to an embodiment. FIG. 8 is a flowchart of a method of manufacturing the temperature sensor 100, according to an embodiment.

Referring to FIGS. 5 and 7, the sensor unit 20 needs to be manufactured before the temperature sensor 100 is manufactured.

The base layer 22 having surface hygroscopicity may be prepared using a paper-making material in operation S11. The paper-making material usually refers to a paper material formed by thinly binding together plant fiber such as wood pulp. In an embodiment, standardized printing paper (e.g., A4 paper) may be used. The surface hygroscopicity may be defined by a sizing degree.

It is important that the base layer 22 has an appropriate sizing degree to enable the electric conductive layer 24 to be adsorbed onto a surface of the base layer 22 during formation of the electric conductive layer 24, which will be described below. The base layer 22 may be formed using a paper-making material having a sizing degree of about 20 g/m$^2$ to about 50 g/m$^2$. When a paper-making material having a sizing degree higher than about 50 g/m$^2$ is used, no conductive polymeric materials are adsorbed onto the surface of the base layer 22 since the paper-making material has a high water resistance. When a membrane or filter paper, which has hardly undergone the sizing process and thus has a sizing degree lower than about 20 g/m$^2$, is used, the electric conductive layer 24 is formed on the base layer 22 since a conductive polymeric material forming the electric conductive layer 24 passes through the base layer 22 together with water and are not adsorbed onto the base layer 22. Accordingly, among paper-making materials, a paper-making material that has the sizing degree of about 20 g/m$^2$ to about 50 g/m$^2$ may be used in the embodiments of the present disclosure.

Thereafter, the coating layer 26 may be formed on the base layer 22 in operation S12. The coating layer 26 may include a hydrophobic material. The hydrophobic material may be a material, which does not have a group, such as a hydroxyl group, an amino group, or a carboxyl group, having an affinity with water molecules. Oil-based ink or acrylic ink may be used for the hydrophobic material.

The coating layer 26 may be formed on the second surface 22b of the base layer 22, and the electric conductive layer 24, which will be described below, may be formed on the first surface 22a of the base layer 22. In one or more embodiments, the coating layer 26 may be selectively formed. When the coating layer 26 is omitted, the electric conductive layer 24 may be formed on each of the opposite surfaces of the base layer 22. However, since the conductive polymeric material of the electric conductive layer 24 is not formed by absorbing the base layer 22, forming a conductive polymer on each of the opposite surfaces of the electric conductive layer 24 does not function to greatly enhance the characteristics of the sensor unit 20. Contrarily, forming the electric conductive layer 24 only on the first surface 22a of the base layer 22 may be more advantageous to manufacturing.

Since the coating layer 26 has hydrophobic property, the electric conductive layer 24 is not formed in a place where the coating layer 26 has been formed. Accordingly, when the coating layer 26 is formed in at least a portion of the first surface 22a of the base layer 22, on which the electric conductive layer 24 will be formed, an area in which the electric conductive layer 24 is formed may be controlled, so that the initial resistance of the sensor unit 20 may also be controlled.

Thereafter, a conductive polymer solution may be formed in operation S13. The conductive polymer solution may be formed by mixing a conductive polymer and water. At this time, a non-conductive material may also be mixed for the control of the initial resistance. A polythiophene group, a polypyrole group, a polyanyiline group, a polyacetylene group, a polyphenylene group, or a mixture thereof may be used for the conductive polymer. In the current embodiment, PEDOT:PSS in the polythiophene group is used.

In an embodiment, a conductive polymer and water may be mixed at a volume ratio of 1:1, and about 1 wt % to 3 wt % non-conductive material may be mixed into the mixture of the conductive polymer and the water. For example, $SiO_x$ or GO may be used for the non-conductive material. The proportion of the non-conductive material may be adjusted according to the design of the initial resistance of the sensor unit 20. The conductive polymer solution may be formed by stirring the resultant mixture for at least six hours at at least 1000 rpm.

The electric conductive layer 24 may be formed on the base layer 22 using the conductive polymer solution in operation S14. At this time, the electric conductive layer 24 may be formed using wet coating, a roll-to-roll method, or the like.

In the current embodiment, the electric conductive layer 24 may be formed by soaking the base layer 22 in the conductive polymer solution. The thickness of the electric conductive layer 24 may be controlled by controlling a soak time during which the base layer 22 is soaked in the conductive polymer solution. The soak time of the base layer 22 may be about 30 minutes or less, and more desirably, about 2 to 5 minutes. When the base layer 22 is soaked in the conductive polymer solution for more than 30 minutes, the base layer 22 formed using a paper-making material may be damaged, such as undergoing dissociation or being torn, and therefore, the sensor unit 20 may not be normally manufactured. Accordingly, the soak time of the base layer 22 is desirably 30 minutes or less.

Figure 6:
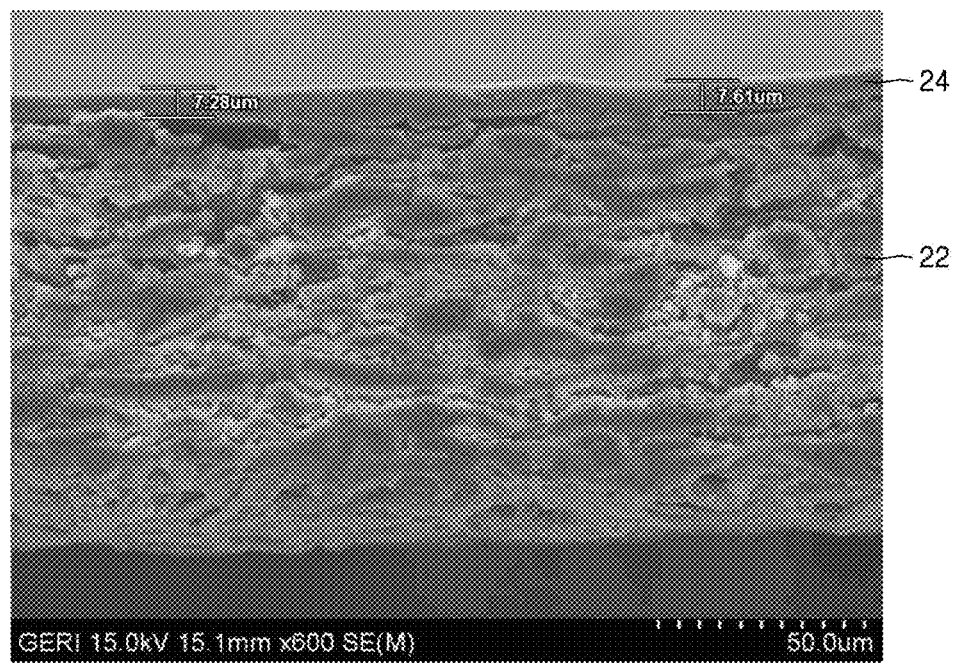
FIG. 6 is a scanning electron microscope (SEM) photo of portion VI of FIG. 5.

FIG. 6 shows a cross-section of the base layer 22, which has been soaked for 30 minutes in the conductive polymer solution. It can be seen that the electric conductive layer 24 has been formed to a thickness of about 7 μm on a surface of the base layer 22. As described above, the most desirable soak time of the base layer 22 is about 2 to 5 minutes. At this time, the electric conductive layer 24 may have a thickness of about 2 μm to 3 μm.

As described above, the coating layer 26 may be formed on at least a portion of the first surface 22a of the base layer 22 before the electric conductive layer 24 is formed. In one or more embodiments, the coating layer 26 may be formed after the electric conductive layer 24 is formed. However, since the electric conductive layer 24 is formed by soaking the base layer 22 in the conductive polymer solution in the current embodiment, forming the coating layer 26 before forming the electric conductive layer 24 is more advantageous in terms of the manufacturing method.

Thereafter, the base layer 22 may undergo a heat treatment in operation S15. A response characteristic of the conductive polymer changes according to the heat treatment. The conductive polymer may be stabilized when the heat treatment is performed for about 10 to 30 minutes at a temperature of about 100° C. to about 200° C.

Thereafter, when necessary, the initial resistance of the base layer 22, on which the electric conductive layer 24 has been formed, may be set. The initial resistance may be set by the thickness of the electric conductive layer 24 (i.e., the soak time of the base layer 22), the width and the length of the base layer 22, etc. Even when the thickness of the electric conductive layer 24 is fixed in the sensor unit 20, a sensor having a different initial resistance may be designed according to the shape (e.g., the width and/or the length) of the base layer 22.

The initial resistance of the sensor unit 20 may be variously designed according to the intended purpose of the sensor unit 20. It is desirable to design the initial resistance of the sensor unit 20 to be about 50 k$\Omega$, so that the sensor unit 20 may be used for a temperature sensor.

The temperature sensor 100 may be manufactured using the sensor unit 20 designed described above.

Referring to FIGS. 2 and 8, after the sensor unit 20 is manufactured in operation S10, as described above, the sensor unit 20 may be positioned on the carrier substrate 10 in operation S20.

The carrier substrate 10 may support the sensor unit 20 and may be formed using a rigid or flexible material. When the carrier substrate 10 is formed using a rigid material, the carrier substrate 10 may include a material such as glass, metal, or ceramics. When the carrier substrate 10 is formed using a flexible material, the carrier substrate 10 may include a plastic material such as PET, PEN, or polyimide. The carrier substrate 10 may be larger than the sensor unit 20, but the present disclosure is not limited thereto.

Thereafter, the pad unit 30 may be formed at the opposite ends of the sensor unit 20 in operation S30. The pad unit 30 may be connected to the opposite ends of the sensor unit 20 to be electrically connected with the sensor unit 20. Referring to FIG. 1, the sensor unit 20 may be positioned on the carrier substrate 10, and the pad unit 30 may be positioned on the sensor unit 20. The pad unit 30 may function as a terminal, which facilitates connection of the sensor unit 20 to an external device (not shown).

The first portions 32a and 34a of the pad unit 30 may be connected to the sensor unit 20. The second portions 32b and 34b of the pad unit 30 may be exposed outside. When the first portions 32a and 34a of the pad unit 30 are connected to the sensor unit 20, it may be considered that the first portions 32a and 34a of the pad unit 30 are in contact with the electric conductive layer 24 of the sensor unit 20. The pad unit 30 may include the first pad 32 and the second pad 34. The first pad 32 may be connected to an end of the sensor unit 20 and the second pad 34 may be connected to an opposite end of the sensor unit 20.

Thereafter, the cover unit 40 may be formed on the sensor unit 20 to cover the sensor unit 20 in operation S40. The sensor unit 20 includes a paper-making material and is thus very sensitive to external humidity. Accordingly, the reliability of the temperature sensor 100 may be secured by sealing the sensor unit 20 with the cover unit 40. The cover unit 40 may cover the entire surface of the sensor unit 20 and at least a portion of the pad unit 30 contacting the sensor unit 20. Referring to FIG. 1, at least a portion of the cover unit 40 may be in direct contact with the carrier substrate 10, thereby maintaining the sealing of the sensor unit 20.

The cover unit 40 may include an insulating material, for example, an organic film, an inorganic film, or an organic-inorganic composite film. The organic film may include polyethylene terephthalate, polyethylene naphthalate, polycarbonate, polyimide, polyethylene sulfonate, polyoxymethylene, polyacrylate, and/or hexamethyldilsiloxane. The inorganic film may include silicon oxide, silicon nitride, and/or silicon oxynitride. The inorganic film may be formed using a transparent or translucent material.

Figure 9:
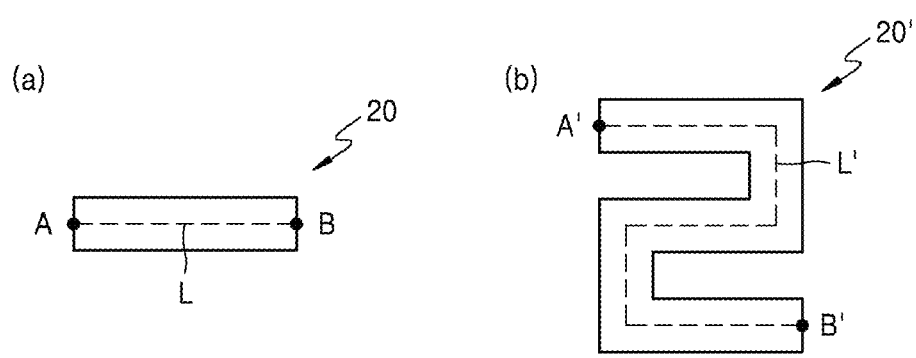
FIG. 9 schematically shows sensor units according to embodiments.

FIG. 9 schematically shows sensor units 20 and 20' according to embodiments.

FIG. 9 shows the sensor units 20 and 20' (hereinafter, refer to as the first and second sensor units 20 and 20', which may be collectively denoted by the sensor unit 20) respectively having different initial resistances.

As described above, the initial resistance may be set by changing the shape of the base layer 22 after forming the electric conductive layer 24 on the base layer 22. The initial resistance may be set by the thickness of the electric conductive layer 24 (i.e., the soak time of the base layer 22), the width and the length of the base layer 22, etc. Even when the thickness of the electric conductive layer 24 is fixed in the sensor unit 20, a sensor having a different initial resistance may be designed according to the shape (e.g., the width and/or the length) of the base layer 22.

Referring to FIG. 9, the first sensor unit 20 may have a different plan shape than the second sensor unit 20'. At this time, it is assumed that the thickness of the electric conductive layer 24 and the width of the base layer 22 are the same between the first and second sensor units 20 and 20'. Accordingly, the initial resistance of each of the first and second sensor units 20 and 20' may be determined by the shape (e.g., the width and/or the length) of the base layer 22.

A pad unit (not shown in an embodiment (a) of FIG. 9) may be connected to points A and B of the first sensor unit 20. A pad unit (not shown in an embodiment (b) of FIG. 9) may be connected to points A' and B' of the second sensor unit 20'.

The first sensor unit 20 may be formed to have a first length L between the points A and B, and the second sensor unit 20' may be formed to have a second length L' between the points A' and B'. In other words, the second length L' of the second sensor unit 20' may be greater than the first length L of the first sensor unit 20. Since resistance is proportional to a length, the initial resistance may be increased when a length between two portions of the pad unit 30, which are connected to the sensor unit 20, is increased as in the case of the second sensor unit 20'.

Although it is assumed that the width of the base layer 22 is the same between the first and second sensor units 20 and 20', the initial resistance may be changed by adjusting the width of the base layer 22.

As described above, the initial resistance of the sensor unit 20 may be controlled by freely changing the shape of the base layer 22. Since the base layer 22 is formed using an easily processable paper-making material in the embodiments, the initial resistance is easily designed.

Figure 10:
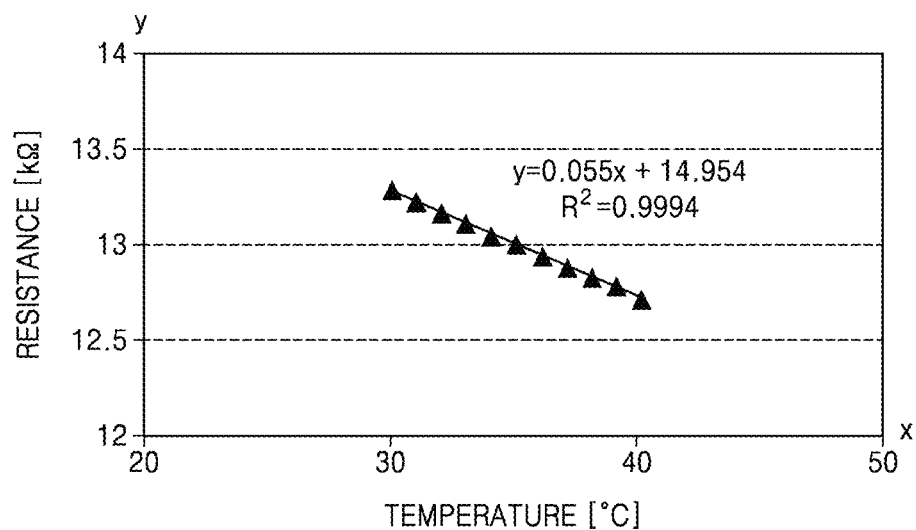
FIG. 10 is a graph of a change in resistance with respect to temperature in a temperature sensor, according to the related art.
Figure 11:
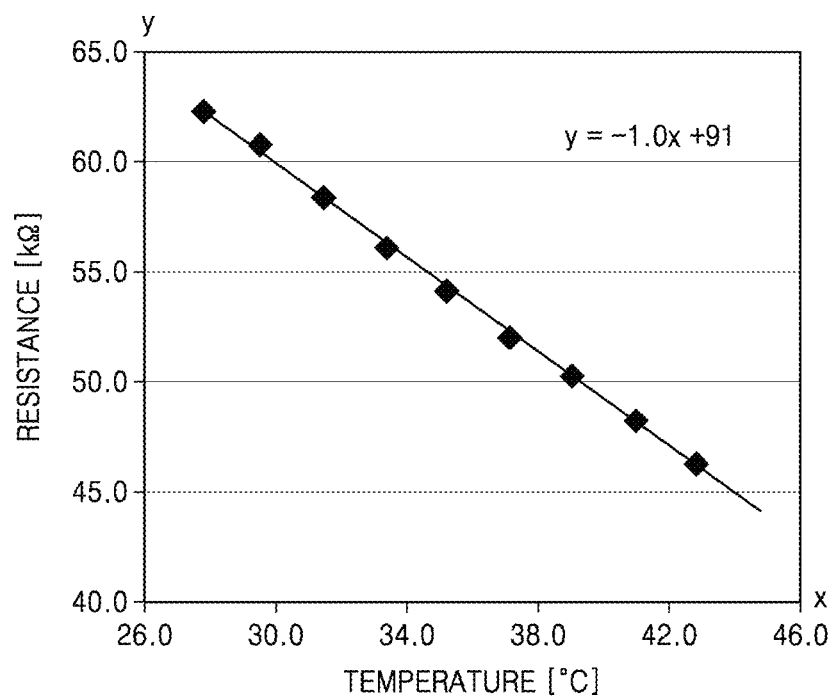
FIG. 11 is a graph of a change in resistance with respect to temperature in a temperature sensor, according to one or more embodiments.

FIG. 10 is a graph of a change in resistance with respect to temperature in a temperature sensor, according to the related art. FIG. 11 is a graph of a change in resistance with respect to temperature in the temperature sensor 100, according to one or more embodiments.

Referring to FIG. 10, the temperature sensor according to the related art has sensitivity which decreases to about 0.05 kΩ/° C. to about 0.25 kΩ/° C. at about 30° C. to about 40° C. The sensitivity of the temperature sensor is different according to a temperature measurement range of an applied product, but when noise of external environments is considered, the higher the sensitivity, products may be manufactured with low-priced circuits. When a sensor's sensitivity to temperature is at least 0.05 kΩ/° C., it is easy to implement a circuit robust to external environment noise. When the sensitivity is low, it is necessary to use another circuit component against external and internal noise or to use an expensive fine device to construct an integrated circuit. According to the specifications of different types of temperature sensors currently commercialized, the sensitivity decreases to about 0.02 kΩ/° C. to about 3 kΩ/° C. at about 25° C. to about 45° C.

Referring to FIG. 11, according to an embodiment, the temperature sensor 100 has sensitivity which decreases to about 0.5 kΩ/° C. to about 2.5 kΩ/° C. at about 30° C. to about 40° C. As compared to the related art, the sensitivity of the temperature sensor 100 is about ten times higher.

When a resistance circuit pattern is formed on a substrate, which includes a plastic material such as PET, PEN, or polyimide, using a conductive polymer in a comparison example, expensive equipment such as inkjet or screen printing equipment is necessary, and a separate surface treatment such as plasma processing is required to secure adhesion to the substrate.

According to the embodiments of the present disclosure, a resistance pattern of the sensor unit 20 having a high sensitivity may be easily designed in the temperature sensor 100, and the temperature sensor 100 may be manufactured without separate equipment or manufacturing processes.

It should be understood that the embodiments described herein should be considered in a descriptive sense only and not for purposes of limitation. Descriptions of the features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope of the disclosure as defined by the following claims.

What is claimed is:

1. An apparatus, comprising:
a temperature sensor including:
a sensor unit for temperature sensing having an electrical resistance that varies according to a temperature, the sensor unit positioned on a carrier substrate and comprising a base layer and an electric conductive layer, the base layer having surface hygroscopicity, and the electric conductive layer being on an external surface of the base layer, wherein the base layer comprises a paper-making material;
a pad unit electrically connected to opposite ends of the sensor unit, the pad unit usable by an external device to measure the electrical resistance of the sensor unit to determine the temperature; and
a cover unit positioned on the sensor unit and covering the sensor unit.

2. The apparatus of claim 1, wherein the pad unit comprises a first pad and a second pad, the first pad being connected to one of the opposite ends of the sensor unit, and the second pad being connected to the other one of the opposite ends of the sensor unit;
wherein a width of the first and second pads in a first direction is substantially equal to a width of the electric conductive layer of the sensor unit in the first direction.

3. The apparatus of claim 1, wherein the electric conductive layer comprises a conductive polymeric material.

4. The apparatus of claim 1, wherein the electric conductive layer comprises one of silicon oxide (SiOx) and graphene oxide (GO).

5. The apparatus of claim 1, wherein the external surface pf the base layer comprises a first surface of the base layer, wherein the base layer has a second surface opposite the first surface, wherein the sensor unit further comprises a coating layer, and wherein the coating layer is positioned on the second surface of the base layer.

6. The apparatus of claim 5, wherein the pad unit is in direct contact with the electric conductive layer.

7. A method of manufacturing a sensor unit for temperature sensing, the method comprising:
preparing a base layer comprising a paper-making material, the base layer having surface hygroscopicity;
forming a conductive polymer solution comprising a conductive polymeric material;
forming an electric conductive layer on a surface of the base layer by soaking the base layer in the conductive polymer solution;
performing a heat treatment on the base layer having the electric conductive layer thereon to change a response characteristic of the conductive polymeric material; and
setting an initial electrical resistance of the sensor unit, the sensor unit with the initial electrical resistance usable to sense a temperature by measuring a change in electrical resistance of the sensor unit.

8. The method of claim 7, wherein the forming of the conductive polymer solution comprises mixing and stirring the conductive polymeric material with a non-conductive material.

9. The method of claim 8, wherein the non-conductive material comprises one of silicon oxide (SiOx) and graphene oxide (GO).

10. The method of claim 7, wherein setting the initial resistance is controlled by a duration of the soak time and by cutting the base layer to selected dimensions.

11. The method of claim 7, wherein the surface of the base layer comprises a first surface of the base layer, wherein the base layer comprises a second surface, and wherein the method further comprises forming a coating layer on the second surface of the base layer before the forming of the electric conductive layer.

12. The method of claim 8, further comprising manufacturing a temperature sensor from the sensor unit, the manufacturing the temperature sensor comprising:
positioning the sensor unit on a carrier substrate;
forming a pad unit at opposite ends of the sensor unit, the pad unit being electrically connected to the sensor unit, the pad unit usable by an external device to measure the change in the electrical resistance of the sensor unit to determine the temperature; and
forming a cover unit on the sensor unit to cover the sensor unit.

13. The method of claim 12, wherein the forming of the pad unit comprises forming a first pad and a second pad, the first pad being connected to one of the opposite ends of the sensor unit, and the second pad being connected to the other one of the opposite ends of the sensor unit;

wherein a width of the first and second pads in a first direction is substantially equal to a width of the sensor unit in the first direction.

\* \* \* \* \*